United States Patent
Iriguchi et al.

(10) Patent No.: US 10,658,240 B1
(45) Date of Patent: May 19, 2020

(54) SEMICONDUCTOR DIE SINGULATION

(71) Applicant: Texas Instruments Incorporated, Dallas, TX (US)

(72) Inventors: Shoichi Iriguchi, Beppu (JP); Hiroyuki Sada, Beppu (JP); Genki Yano, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/291,995

(22) Filed: Mar. 4, 2019

Related U.S. Application Data

(60) Provisional application No. 62/787,105, filed on Dec. 31, 2018.

(51) Int. Cl.
| | |
|---|---|
| *H01L 21/78* | (2006.01) |
| *H01L 21/683* | (2006.01) |
| *H01L 23/00* | (2006.01) |
| *H01L 21/56* | (2006.01) |
| *B23K 26/364* | (2014.01) |
| *B23K 101/40* | (2006.01) |

(52) U.S. Cl.
CPC ............ *H01L 21/78* (2013.01); *B23K 26/364* (2015.10); *H01L 21/561* (2013.01); *H01L 21/565* (2013.01); *H01L 21/6836* (2013.01); *H01L 24/09* (2013.01); *H01L 24/49* (2013.01); *H01L 24/97* (2013.01); *B23K 2101/40* (2018.08)

(58) Field of Classification Search
None
See application file for complete search history.

(56) References Cited

U.S. PATENT DOCUMENTS

| | | | | |
|---|---|---|---|---|
| 2014/0127880 A1* | 5/2014 | Grivna | .................... | H01L 21/78 |
| | | | | 438/458 |
| 2014/0127885 A1* | 5/2014 | Grivna | .................... | H01L 21/78 |
| | | | | 438/464 |
| 2015/0332969 A1* | 11/2015 | Grivna | .................... | H01L 21/78 |
| | | | | 438/462 |
| 2017/0352593 A1* | 12/2017 | Grivna | ................ | H01L 21/6836 |
| 2019/0080963 A1* | 3/2019 | Lapke | .................... | B23K 26/53 |

* cited by examiner

*Primary Examiner* — Angel Roman
(74) *Attorney, Agent, or Firm* — Dawn Jos; Charles A. Brill; Frank D. Cimino

(57) ABSTRACT

In a described example, a method includes: forming stress induced dislocations along scribe lanes between semiconductor dies on a semiconductor wafer using a laser; mounting a first side of the semiconductor wafer on the first side of a first dicing tape; removing a backgrinding tape from the semiconductor wafer; attaching a second dicing tape to a second side of the semiconductor wafer opposite the first side, the second dicing tape adhering to portions of the first dicing tape that are spaced from the semiconductor wafer, forming a dual taped wafer dicing assembly; separating the semiconductor dies by stretching the first dicing tape and stretching the second dicing tape; removing the second dicing tape from the semiconductor dies; and removing the semiconductor dies from the first dicing tape.

26 Claims, 9 Drawing Sheets

SEMICONDUCTOR DIE SINGULATION

CROSS REFERENCE TO RELATED APPLICATIONS

This application claims the benefit under 35 U.S.C. § 119(e) to co-owned U.S. Provisional Patent Application Ser. No. 62/787,105, filed Dec. 31, 2018, titled "SEMICONDUCTOR DIE SINGULATION, which is hereby incorporated herein by reference.

TECHNICAL FIELD

This disclosure relates generally to semiconductor dies, and more particularly to a method of semiconductor die singulation.

SUMMARY

In a described example, a method includes: mounting a device side of a semiconductor wafer on a first side of a backgrinding tape; loading the backgrinding tape and semiconductor wafer into a dicing tool; forming stress induced dislocations along scribe lanes between semiconductor dies on the semiconductor wafer using a laser in the dicing tool. The method continues by attaching an adhesive on a first side of a first dicing tape to a first side of a dicing ring; mounting a first side of the semiconductor wafer on the first side of the first dicing tape, forming a wafer dicing assembly; removing the backgrinding tape from the semiconductor wafer; attaching a first side of a second dicing tape that has an adhesive to a second side of the semiconductor wafer opposite the first side, the second dicing tape adhering to portions of the first dicing tape that are spaced from the semiconductor wafer; and adhering the second dicing tape to a second side of the dicing ring, forming a dual taped wafer dicing assembly. The dual taped wafer dicing assembly is loaded into a die singulation tool with a dicing tape stretching table; the method then separates the semiconductor dies by stretching the first dicing tape and stretching the second dicing tape with the dicing tape stretching table; and the method continues by removing the second dicing tape from the semiconductor dies; and removing the semiconductor dies from the first dicing tape. In additional example methods, the singulated semiconductor dies are packaged to form packaged semiconductor devices.

DETAILED DESCRIPTION

Figure 1A:
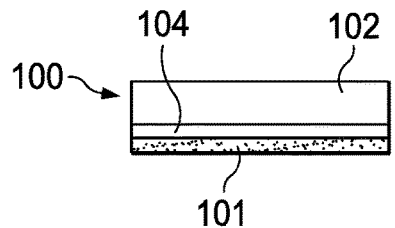
FIGS. 1A-1G are cross sectional views of the major steps for singulating semiconductor dies using laser dicing.

Corresponding numerals and symbols in the different figures generally refer to corresponding parts, unless otherwise indicated. The figures are not necessarily drawn to scale.

The term "scribe lane" is used herein. A scribe lane is a portion of semiconductor wafer between semiconductor dies. Sometimes in related literature the term "scribe street" is used. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

Elements are described herein as "coupled." As used herein, the term "coupled" includes elements that are directly connected, and elements that are electrically connected even with intervening elements or wires are also coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micromechanical device, such as a digital micromirror device (DMD) or a MEMS device.

The term "stress induced dislocation" is used herein. In laser dicing, laser energy is focused into particular locations within a semiconductor substrate. The laser energy melts a portion of the semiconductor material forming polysilicon regions. Because the polysilicon takes a larger area than the semiconductor crystal lattice, forming it induces stress and dislocates the semiconductor crystal lattice in the region affected by the laser energy, resulting in a stress induced dislocation in the semiconductor substrate. In a mechanical sawing operation, a saw blade is used to partially cut the semiconductor substrate, forming stress induced dislocations in the crystal lattice of the semiconductor substrate. When the substrate is then pulled on using a dicing tape, the stress induced dislocations can be propagated to form openings that eventually extend through the semiconductor substrate, the openings formed along the scribe lanes and thus forming rectangular semiconductor dies.

FIGS. 1A through 1F are cross sectional views of the major manufacturing steps for singulating semiconductor dies.

FIG. 1A shows a semiconductor wafer 100 positioned over a backgrinding tape 101. Semiconductor devices 104 such as a resistors, capacitors, transistors, analog circuits, or integrated circuits, are built on and in the surface of the substrate 102 of the semiconductor wafer 100. The semiconductor devices are separated from one another by scribe lanes (not shown in FIG. 1A) that run between the semiconductor devices and intersect one another to surround each of the semiconductor devices 104 on four sides.

Figure 1B:
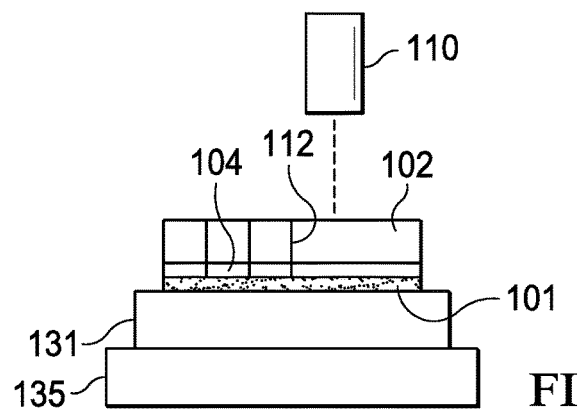

In FIG. 1B, illustrates a laser dicing method in which a laser 110 is used to form stress induced dislocations 112 along defined scribe lanes in the semiconductor substrate 102. (In some literature, this laser dicing method is referred to as a "stealth dicing" method because the laser is focused to affect regions within the semiconductor substrate, but does not cut through the entire substrate. In the laser dicing method, the wafer assembly is loaded into a laser dicing tool. In an example method, the wafer assembly can have the backgrinding tape 101 held by a vacuum chuck 131 and supported by a vacuum chuck support 135. The wafer assembly is positioned with the non-device side (backside) of the semiconductor wafer 100 facing the laser 110. Laser light is projected into the substrate 102 from the non-circuit side (backside) of the semiconductor wafer 100 forming stress induced dislocations 112 along the scribe lanes. The laser can be focused at particular depths in the semiconductor wafer to form stress induced dislocations 112 within the semiconductor wafer 100. Multiple passes of laser energy focused at different depths can be used to form the stress induced dislocations 112. A single pass can include more than one laser beam with different beams focused at more than one depth within the semiconductor substrate 102 to form stress induced dislocations 112 at the different depths.

Figure 1C:
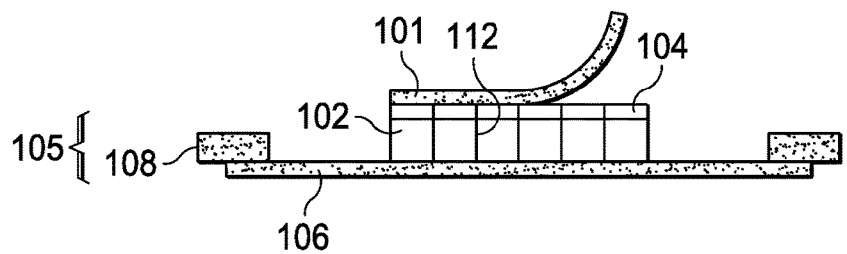

In FIG. 1C a sticky side of a dicing tape 106 is adhered to the bottom surface (as oriented in FIG. 1B) of a flexible dicing frame 108. The semiconductor wafer 100 is positioned in the center of the dicing ring 108 and is adhered to a sticky side of the dicing tape 106, forming a wafer dicing assembly 105. The flexible dicing frame 108 supports the dicing tape 106 and the semiconductor wafer 100 in a dicing tool (not shown in FIG. 1B). The dicing tool will operate to form openings in the semiconductor substrate along the scribe lanes between the semiconductor dies 103 (see FIG. 1F). The frame 108 also supports the wafer dicing assembly 105 in the dicing tool. A dicing tape stretching table in the die singulation tool stretches the dicing tape 106 to separate the dies 103 from one another (see 118 in FIG. 1F). In FIG. 1C, the backgrinding tape 101 is shown being peeled away from the wafer 100 and the devices 104.

Figure 1D:
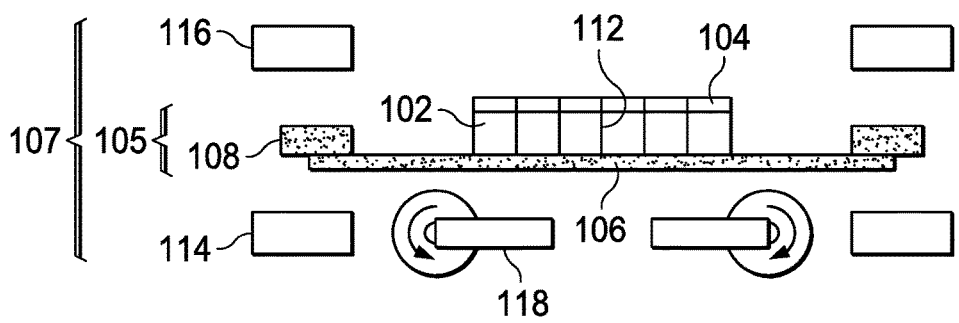

As illustrated in FIG. 1D the wafer dicing assembly 105 is loaded into a dicing tool 107 which consists of first clamps 114 and second clamps 116 for securing the wafer dicing assembly 105 in place. The non-sticky side of the dicing tape 106 faces the dicing tape stretching table 118. The wafer 100 is mounted on the opposing sticky side of the dicing tape 106. When the dicing tool is operated, dicing tape stretching table 118 stretches the dicing tape 106.

Figure 1E:
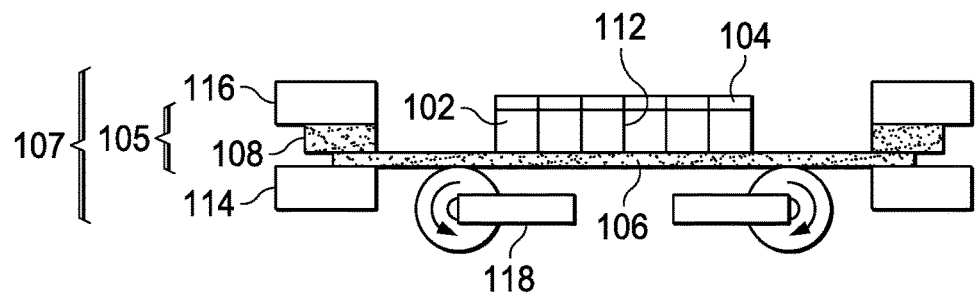

As illustrated in FIG. 1E, the first clamp 114 and the second clamp 116 hold the flexible dicing frame 108 portion of the wafer dicing assembly 105 securely in place over the tape stretching table 118. The non-sticky side of the dicing tape 106 faces the tape stretching table 118. Note that the dicing tape 106 is stretched in all directions, even though the cross sectional views show only a portion of the dicing tape and wafer that are visible in cross section, but the tape stretching tool 118 applies force in a circumference around the semiconductor wafer 100 and stretches the dicing tape 106 in all directions, causing the dies 103 to separate along the scribe lanes on all four sides of each die 103, forming rectangular dies as the dies 103 separate from one another.

Figure 1F:
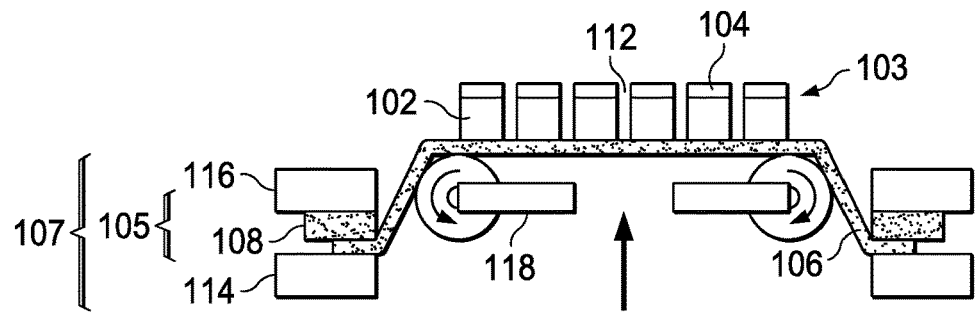

As illustrated in FIG. 1F, the tape stretching table 118 is raised against the dicing tape 106 causing it to stretch. The force applied by the tape 106 as it stretches causes dislocations 112 to propagate completely through the semiconductor substrate 102 along the scribe lanes. As the dicing tape 106 is additionally stretched, the semiconductor dies 103 are separated one from another as gaps open between the semiconductor dies 103 along the scribe lanes, to singulate the dies 103.

Figure 1G:
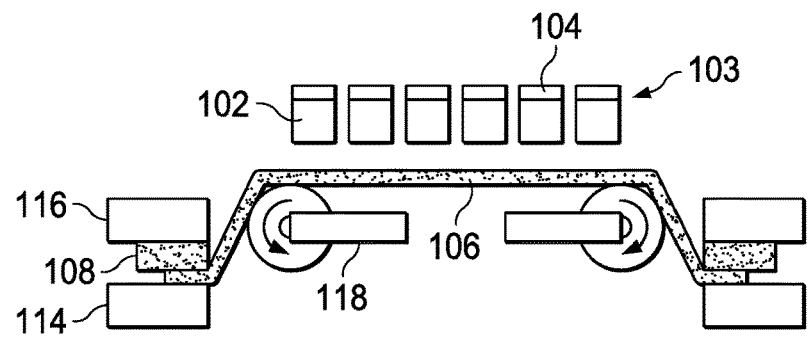

As illustrated in FIG. 1G, the singulated semiconductor dies 103 are then removed from the dicing tape 106. This can be done using pick and place equipment, for example.

Figure 2:
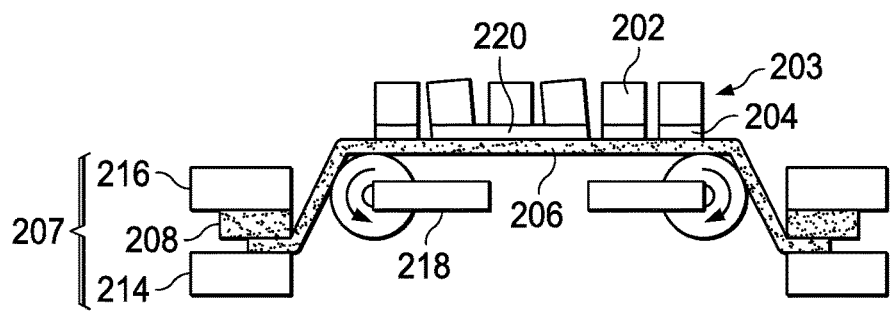
FIG. 2 is a cross section illustrating the singulation of dies on a semiconductor wafer by stretching dicing tape using a tape stretching table.
Figure 3:
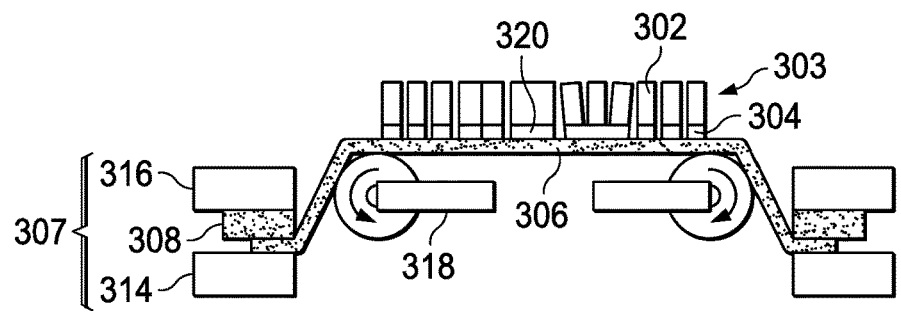
FIG. 3 is a cross section illustrating the singulation of dies on a semiconductor wafer by stretching dicing tape using a tape stretching table.

FIGS. 2 and 3 are cross-sectional views that illustrate issues that can arise in singulating semiconductor dies, particularly when the semiconductor dies have a thick layer of coating material or interconnect metal. In FIG. 2 similar reference labels are used for similar elements as are shown in FIG. 1A, for clarity. For example, substrate 202 in FIG. 2 corresponds to substrate 102 in FIG. 1A. Dicing tool 207 has clamps 216, 214 securing the ring 208 and the dicing tape 206 which carries semiconductor wafer 200, including semiconductor devices 204 and substrate 202. The thick layer of interconnect or passivation coating material over the semiconductor devices 204 can sometimes fail to crack apart and separate during singulation, resulting in bridged material (220 in FIG. 2) connecting un-singulated semiconductor dies 203. For example, the semiconductor dies 203 can fail to singulate when the top layer of interconnect has a thickness of 2-3 μm or greater and when the passivation coater material has a thickness of about 7 μm or greater. Singulation failure of the semiconductor dies results in costly scrap, increasing manufacturing costs.

FIG. 3 illustrates another problem that can occur in singulating dies when semiconductor dies are relatively small, for example, dies with dimensions of 1 mm on a side, or less. In FIG. 3 similar reference labels are used for similar elements as are shown in FIG. 1A, for clarity. For example, substrate 302 in FIG. 3 corresponds to substrate 102 in FIG. 1A. Wafers manufactured with small dies have many more scribe lanes per wafer (compared to wafers with larger sized dies). The force applied by the stretching dicing tape 306 is therefore divided between many more scribe lanes. The force applied per scribe lane is thus significantly less for singulation on wafers with small dies than for similar wafers with larger dies. In some cases, such as illustrated in FIG. 3, some of the small dies 303 can fail to singulate, leaving bridging material between dies 303, shown as 320. This also results in costly scrap.

Figure 4A:
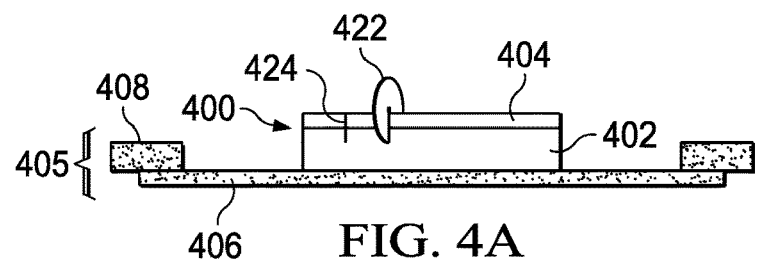
FIGS. 4A-4C are cross sectional views of the major steps for singulating semiconductor dies using wafer sawing.
Figure 4B:
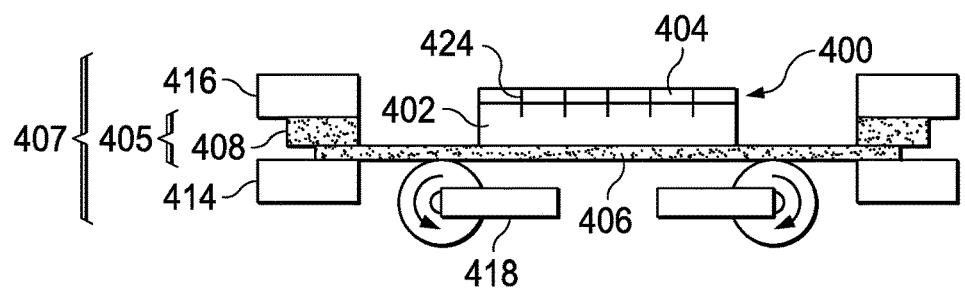
Figure 4C:
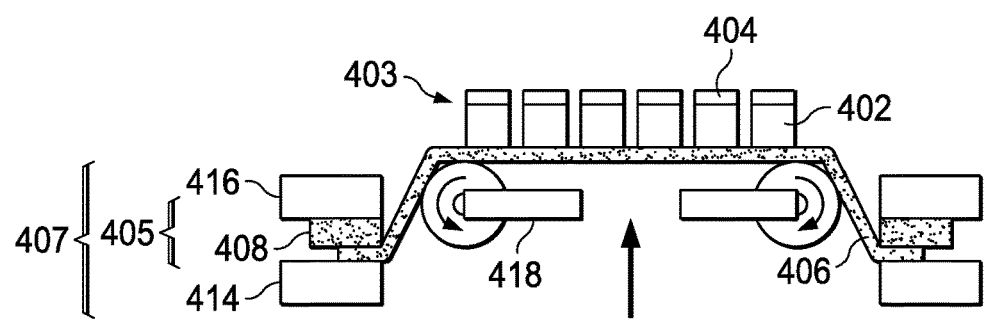

FIGS. 4A, 4B, and 4C illustrate an alternative method for singulating semiconductor dies. In FIGS. 4A, 4B and 4C similar reference labels are used for similar elements as are shown in FIG. 1A. For example, substrate 402 in FIGS. 4A, 4B and 4C corresponds to substrate 102 in FIG. 1A.

In FIG. 4A shows a wafer dicing assembly 405 consisting of a semiconductor wafer 400 mounted on the sticky side of dicing tape 406. In this example, the sticky side of the dicing tape 406 is adhered to a dicing tape support ring 408. The semiconductor wafer 400 is shown in FIG. 4A with the non-device side (substrate 402) of the wafer 400 adhered to the sticky side of the dicing tape 406. This is optional. In an alternative approach using a wafer sawing method, the device side 404 of the wafer 400 can instead be adhered to the sticky side of the dicing tape 406. A dicing saw 422 can be used to form partial cuts 424 through the semiconductor wafer 400 to form stress induced dislocations along the scribe lanes. In an example arrangement the partial cut 424 is at least half way through the semiconductor wafer 400. In additional examples the cut can extend from about 70% and up to 99% of the wafer. In an alternative to a mechanical sawing, a laser saw can be used to cut into the surface of the semiconductor wafer at least half way through.

In FIG. 4B the wafer dicing assembly 405 is shown clamped between a first clamp 414 and a second clamp 416 in a dicing tool. The clamps 414, 416 are used to position the mounted wafer assembly 407 over the dicing tape stretching table 418.

FIG. 4C illustrates the dicing tape stretching table 418 in operation. In FIG. 4C the dicing tape stretching table 418 is raised against the non-sticky surface of the dicing tape 406 in the wafer dicing assembly 407 and pushes against the dicing tape 406, causing it to stretch. As the dicing tape 406 is stretched, the force applied by the stretching dicing tape 406 causes the cuts 424 to propagate completely through the semiconductor substrate 402. As the dicing tape 406 is additionally stretched, the semiconductor dies 403 are separated from one another as gaps open between semiconductor dies 403. Then, singulated semiconductor dies 403 are removed from the dicing tape 406. As described hereinabove, although the cross sectional views show the dicing tape stretching table 418 contacting the dicing tape 406 at two positions that are visible in the cross sectional view of FIGS. 4B-4C, in the dicing tool the dicing tape stretching tool 418 contacts the dicing tape 406 in a circular pattern around the semiconductor substrate 402, and as the force is applied, the tape 406 is stretched in all directions. The stress induced dislocations caused by the cuts in the scribe lanes on each side of the semiconductor dies propagate through the substrate and form openings due to the force applied to stretch the dicing tape 406, and the force applied by the stretched dicing tape 406 pulls the semiconductor dies 403 apart to form rectangular dies. Use of mechanical sawing as shown in FIG. 4A can cause defects in the singulated dies including loss of dies 403 due to "fly off", particularly for dies of less than 1 mm dimension. Additional issues can occur due to chipping and damage to the side surfaces and back surfaces of the singulated dies, reducing yield.

Figure 7:
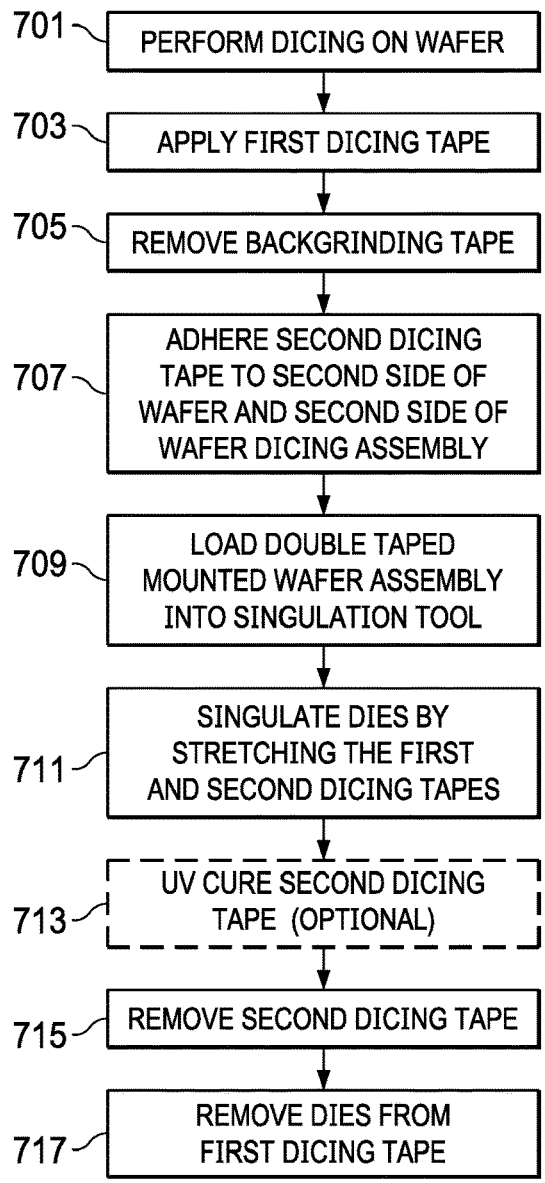
FIG. 7 is a flow diagram illustrating a method such as the method of FIGS. 5A-5H.

FIGS. 5A through 5H illustrate the major steps in an example method. In FIGS. 5A through 5H, similar reference labels are used for similar elements as are shown in FIG. 1A. For example, substrate 502 in FIGS. 5A through 5H corresponds to substrate 102 in FIG. 1A. FIG. 7 is a process flow that describes the manufacturing steps illustrated in FIGS. 5A through 5H.

Figure 5A:
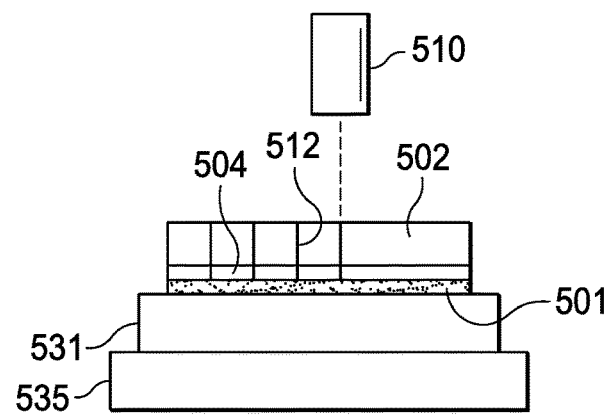
FIGS. 5A-5H are cross sectional views of the major steps for singulating semiconductor dies one from another using dicing tape on both sides of the semiconductor wafer.

FIG. 5A shows a substrate 502 with devices 504 is mounted on a backgrinding tape 501 and being subjected to a laser dicing process (sometimes referred to as a "stealth dicing" process) from the backside. Backgrinding tape 501 is positioned on a vacuum chuck 531 which is on a support 535 that supports the substrate 502. Laser 510 is scanned across the substrate 502 and forms stress induced dislocation regions 512 in scribe lanes.

Figure 5B:
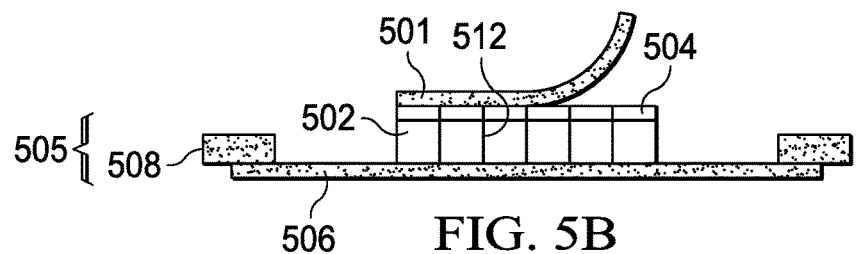

In FIG. 5B, a dicing tape 506 and a flexible dicing frame 508 form a wafer dicing assembly 505. The dicing tape 506 can be one of many dicing tapes that are commercially available, but in a particular example process the tape 506 is type UE-110BJ from Nitto Denko Corporation, and has a thickness of about 105 μm. The wafer dicing assembly 505 is formed (step 701, FIG. 7) by adhering the sticky side of a first dicing tape 506 to a first surface of the dicing ring 508. The backside of a semiconductor wafer is positioned in the center of the dicing ring 508 and is adhered to the sticky side of the first dicing tape 506 forming the wafer dicing assembly 505. The dicing ring 508 supports the first dicing tape 506 and the semiconductor wafer 500 in the dicing tool. The semiconductor wafer includes substrate 502 and semiconductor devices 504. In FIG. 5B, the backgrinding tape 501 is shown being peeled away from the substrate 502.

Figure 5C:
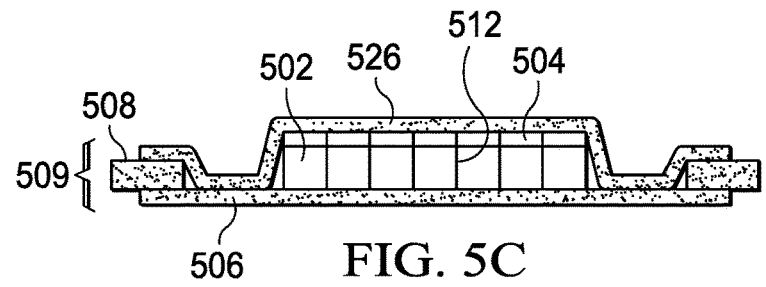

In FIG. 5C (step 707, FIG. 7) the sticky side of a second dicing tape 526 is shown adhered to the second side of the semiconductor device wafer 500 and to the second side of the dicing ring 508. This forms a double taped wafer dicing assembly 509. The second dicing tape 526 can be one of many dicing tapes that are commercially available, and can be the same type of dicing tape as 506, or can be a different type. The second dicing tape needs to be peelable or otherwise removable from the assembly in later steps. In an example, the second dicing tape was type UE-111AJ, from Nitto Denko Corporation, with a thickness of about 107 μm. In an area outside of the circumference of wafer 500, the second dicing tape 526 is adhered to the sticky side of the first dicing tape 506. Adhering the tapes to one another keeps the two tapes stretching together at the same rate in a stretching step described hereinbelow.

Figure 5D:
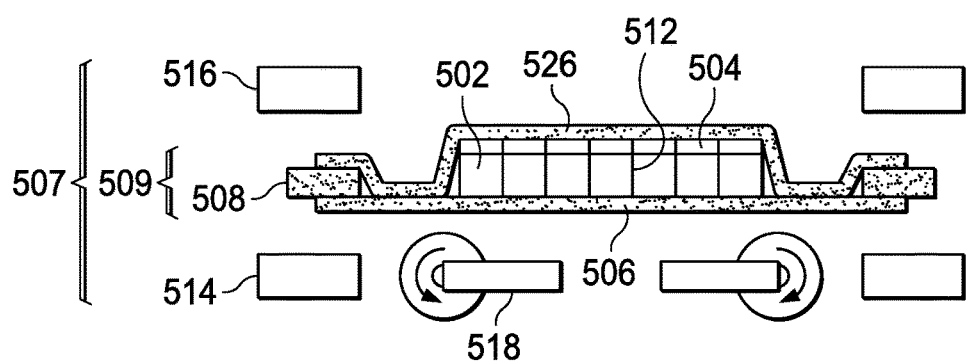

The double taped wafer dicing assembly 509 is shown loaded into a dicing tool 507 in FIG. 5D (step 709), and is positioned over a tape stretching table 518.

Figure 5E:
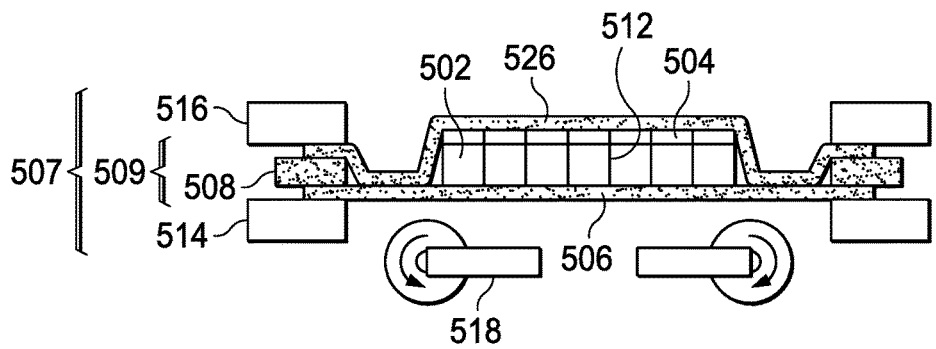

FIG. 5E shows the dicing ring 508 is clamped between a first clamp 514 against the first dicing tape 506 and the first side of the dicing ring 508 and a second clamp 516 against the second dicing tape 526 and the second side of the dicing ring 508. The clamps 514 and 516 hold the double taped wafer dicing assembly 509 in place above the tape stretching table 518.

Figure 5F:
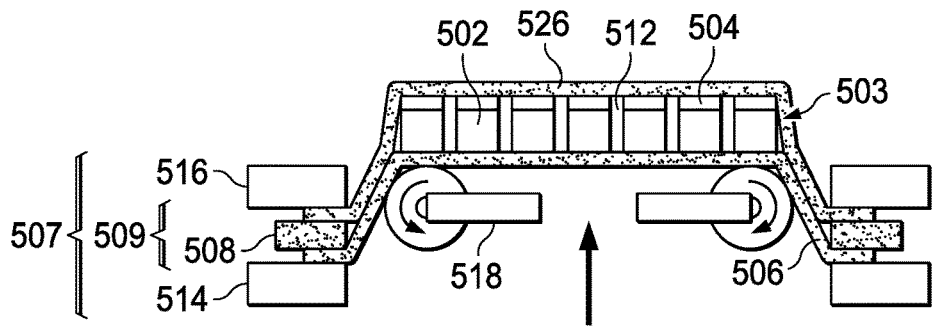

FIG. 5F (step 711) shows the tape stretching table 518 being raised against the non-sticky side of the first dicing tape 506, causing the first dicing tape 506 and the second dicing tape 526 to stretch simultaneously together. As the dicing tapes 506 and 526 stretch, force is applied by the stretching dicing tapes, causing stress induced dislocations 512 to propagate within the substrate along the scribe lanes and eventually forming openings that extend completely through the semiconductor substrate 502. As the dicing tapes 506 and 526 are additionally stretched, the semiconductor dies are separated as the stress induced dislocations become open gaps between semiconductor dies 503. Note that the stretching force is applied in all directions by the dicing tape stretching tool 518, so that the gaps propagate in the scribe lanes on all four sides of the semiconductor dies 503.

Figure 5G:
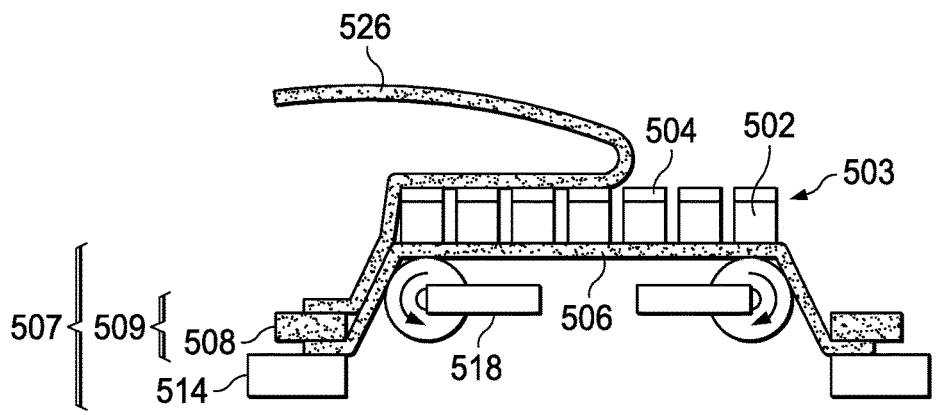

FIG. 5G (step 715) shows the second clamp 516 released from against the second dicing tape 526 and the second dicing tape 526 being removed. In this example, the second dicing tape 526 is mechanically peeled from the assembly 509, while the first dicing tape 506 remains in place, supporting the semiconductor dies 503.

Figure 5H:
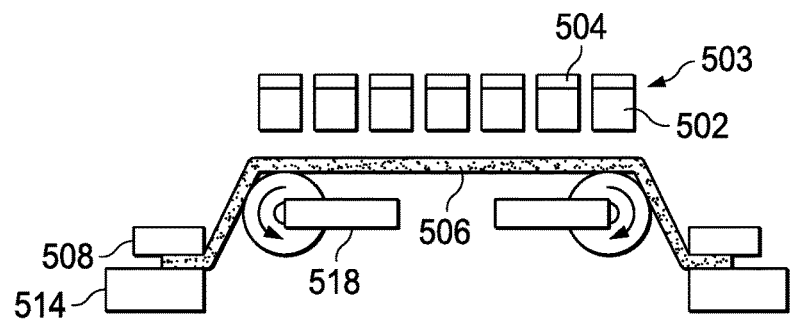

In FIG. 5H (step 717) the singulated dies 503 are shown being removed from the first dicing tape 506. This can be done, for example, using pick and place tools.

The second dicing tape 526 applies additional force (compared to a single dicing tape system) to the stress induced dislocations 512 between the dies 503 as the tapes stretch. The force applied to the wafer approximately doubles using the arrangements with dual dicing tapes (when compared to a single dicing tape.) The additional force applied eliminates the bridging between semiconductor dies 503 (see 220, FIG. 2) that sometimes prevents dies (203 in FIG. 2) from singulating on wafers with a thick top metal or a thick top coating material. The second dicing tape 526 also eliminates dies (see 303, FIG. 3) that fail to singulate on wafers with small dies of less than 1 mm dimension. Use of the arrangements increases overall die yield. Yield is especially increased for semiconductor dies such as 503 with a thick interconnect metal or topcoat. Yield is also especially increased for semiconductor wafers with small (less than about 1 mm) die size.

Figure 6A:
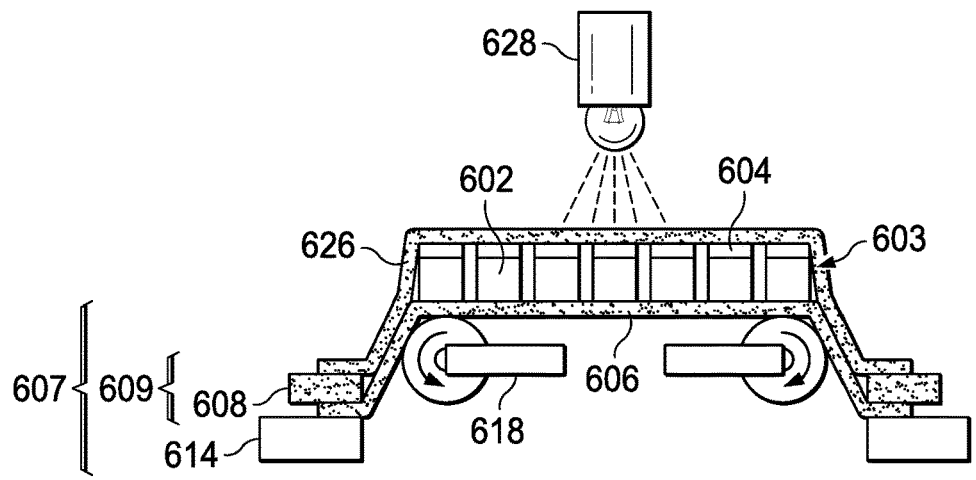
FIGS. 6A-6C are cross sectional views of the major steps for removing a second dicing tape with a light sensitive adhesive.
Figure 6B:
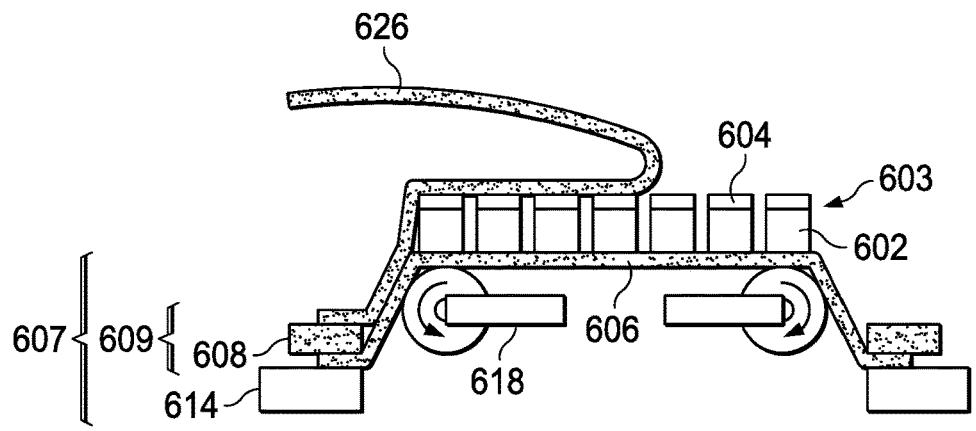
Figure 6C:
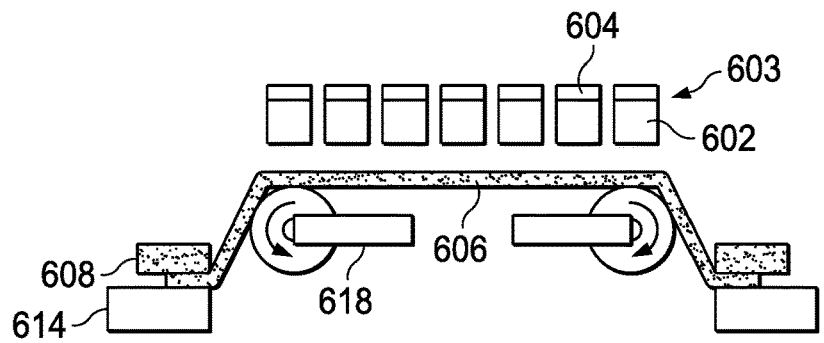

FIGS. 6A-6C illustrate in a series of cross sections an alternative example method for removing the second dicing tape 626 after stretching and die separation. In FIGS. 6A through 6C, similar reference labels are used for similar elements as are shown in FIG. 1A. For example, substrate 602 corresponds to substrate 102 in FIG. 1A.

In this arrangement, the adhesive on the second dicing tape 626 is light sensitive. Upon exposure to light, this light sensitive adhesive loses its adhesive properties. This can be referred to as "UV-release" dicing tape, or "photo-release" dicing tape. Although UV release dicing tape is commonly used, other light frequencies can also be used.

In FIG. 6A, (step 713, FIG. 7) assembly 609 is shown with substrate 602 between dicing tapes 626 and 606 in dicing tool 607. Outside of the circumference of the wafer the two dicing tapes are adhered to one another, to assure that when stretched, the two tapes stretch together. The assembly 609 is shown after separation of the dies 603 (see FIG. 5F, for example). In FIG. 6A, the cross section shows a light source 628 that exposes the light sensitive adhesive on the second dicing tape 626. For example, it can be UV light. The type of light applied is determined by the tape adhesive used.

FIG. 6B (step 715 in FIG. 7) shows the second dicing tape 626 now easily removed from the dies 603, since the second dicing tape 626 no longer adheres to the dies 603.

FIG. 6C (step 717 in FIG. 7) shows the individual dies 603 being removed from the first dicing tape 606.

When the same type of dicing tape is used for both the first dicing tape 506 (see FIG. 5) and the second dicing tape 526, dies 503 may adhere to the second dicing tape 526 when it is removed. The use of the light sensitive release second dicing tape 626 (see FIG. 6) eliminates this issue.

Alternative tape types can be used in the arrangements. In the example arrangements, after singulation as described hereinabove, the second dicing tape is removed, while the singulated dies remain on the first dicing tape. In an alternative method, the first tape can be removed while the singulated dies remain on the second dicing tape. Other tape types can be used in additional alternatives that enable removal of one of the two dicing tapes while the other tape remains in place. Light sensitive tape, including UV release tape, can be used as described herein. In an alternative, light sensitive release dicing tape can be used for both the first and second dicing tapes. In a further alternative, the first dicing tape can also be light or UV sensitive for release, and light can expose the backside of the first dicing tape after the second dicing tape has been removed, making picking the semiconductor dies from the first tape easier to perform. Other arrangements can use tape that is not light sensitive or that releases the adhesive in response to a chemical treatment, or that is simply mechanically removed as shown hereinabove.

Figure 8:
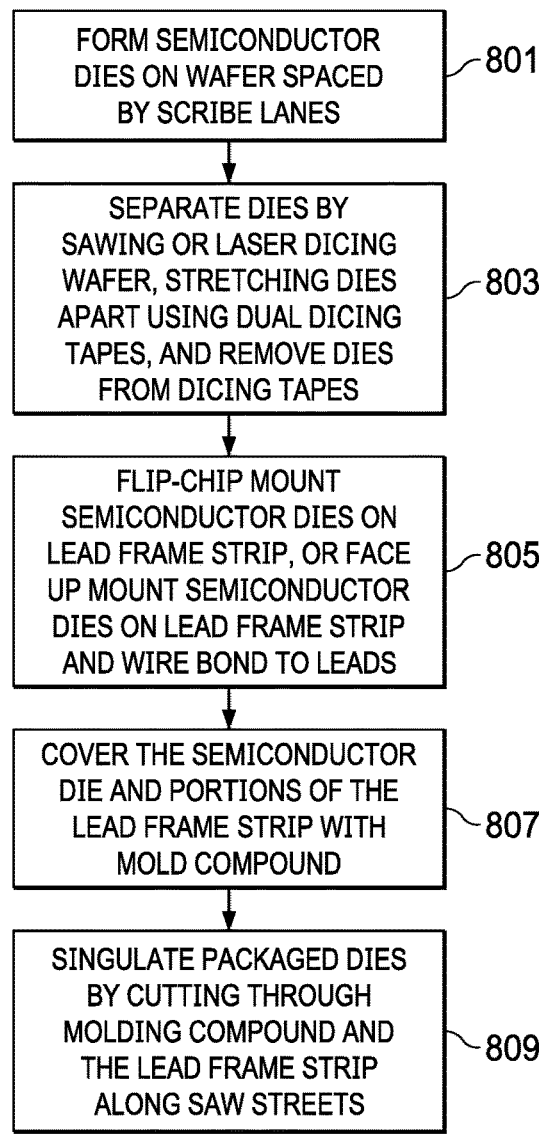
FIG. 8 is a flow diagram illustrating a method of forming a packaged semiconductor device for use with the method of FIG. 7.

FIG. 8 is a flow diagram that illustrates a method for packaging the semiconductor dies to form packaged semiconductor devices.

In step 801, semiconductor dies are formed on a semiconductor wafer spaced from one another by scribe lanes.

In step 803, the semiconductor dies are separated from one another using either the laser dicing, mechanical sawing, or laser sawing processes described above, and using the dual dicing tapes that are stretched at the same time to separate the dies along the scribe lanes as described above. The dies are then singulated and pick and place operations remove the semiconductor dies from the dicing tapes as described above.

At step 805, the semiconductor dies are mounted on a substrate. In one example the substrate can be conductive metal lead frames in a lead frame strip. A lead frame strip includes several lead frames, each having leads and a die mount area supported by removable portions of the lead frame strip. Materials for lead frames include copper and alloys of copper, copper plated nickel or other base material, Alloy 42, stainless steel, other conductive materials. Bondable or solderable coatings such as nickel, palladium, tin, solder, combinations of these, or other coatings can be formed over the substrate to aid in making solder or wire bond connections to the leads of the substrate. Other substrates that can be used include molded interconnect substrates (MIS) with conductors formed in a matrix with dielectric material such as mold compound or epoxy, or a partially etched or "half-etched" metal substrate. Premolded lead frame (PMLF) substrates can be used. The semiconductor dies are placed on die mount areas of the substrate. In an example process several die mount areas are provided in an array or matrix for forming several packages simultaneously, using the substrate that is provided as an array or strip. In a flip-chip method, the semiconductor die is placed with the active circuitry facing the substrate strip. Solder bumps or pillar bumps on bond pads of the semiconductor die are placed in contact with portions of the leads in the substrate, and solder reflow is performed to electrically connect and mechanically bond the solder bumps or pillar bumps to the leads. In a wire bond method, the semiconductor die is placed with the active circuitry facing away from the substrate strip. Bond wires are attached to bond pads of the semiconductor dies and to lead portions of the leads of the substrate to electrically connect the semiconductor dies to the leads. If the substrate is a lead frame, removable portions of the lead frame keep the leads in place during packaging, these removable portions are then trimmed away after the die is mounted, bonded and covered with a dielectric material such as mold compound.

At step 807, a mold compound is applied over the semiconductor dies. The mold compound covers the semiconductor die and at least portions of the substrate strip. Portions of the leads are also not covered with mold compound so that these portions can later be used to make electrical connections to the packaged semiconductor device. In an encapsulation molding process a liquid mold compound can be applied over the semiconductor die and portions of the substrate, and then cured to form a package body. A thermoset plastic resin can be provided as a solid, heated to a liquid state, pressed into a mold containing the substrate strip, and then cured to form a solid package. Room temperature liquid material, such as resins, epoxies and polymers, can be applied and cured simply using time or by applying UV or thermal energy to become cured and form a solid package.

At step 809, the packaged semiconductor dies and lead frames are singulated from one another by cutting between the lead frames in saw streets in the substrate strip. If the mold compound also covers the saw street areas (for example in a "block molding" process), the mold compound is also cut through to singulate the packaged semiconductor devices from one another.

Figure 9:
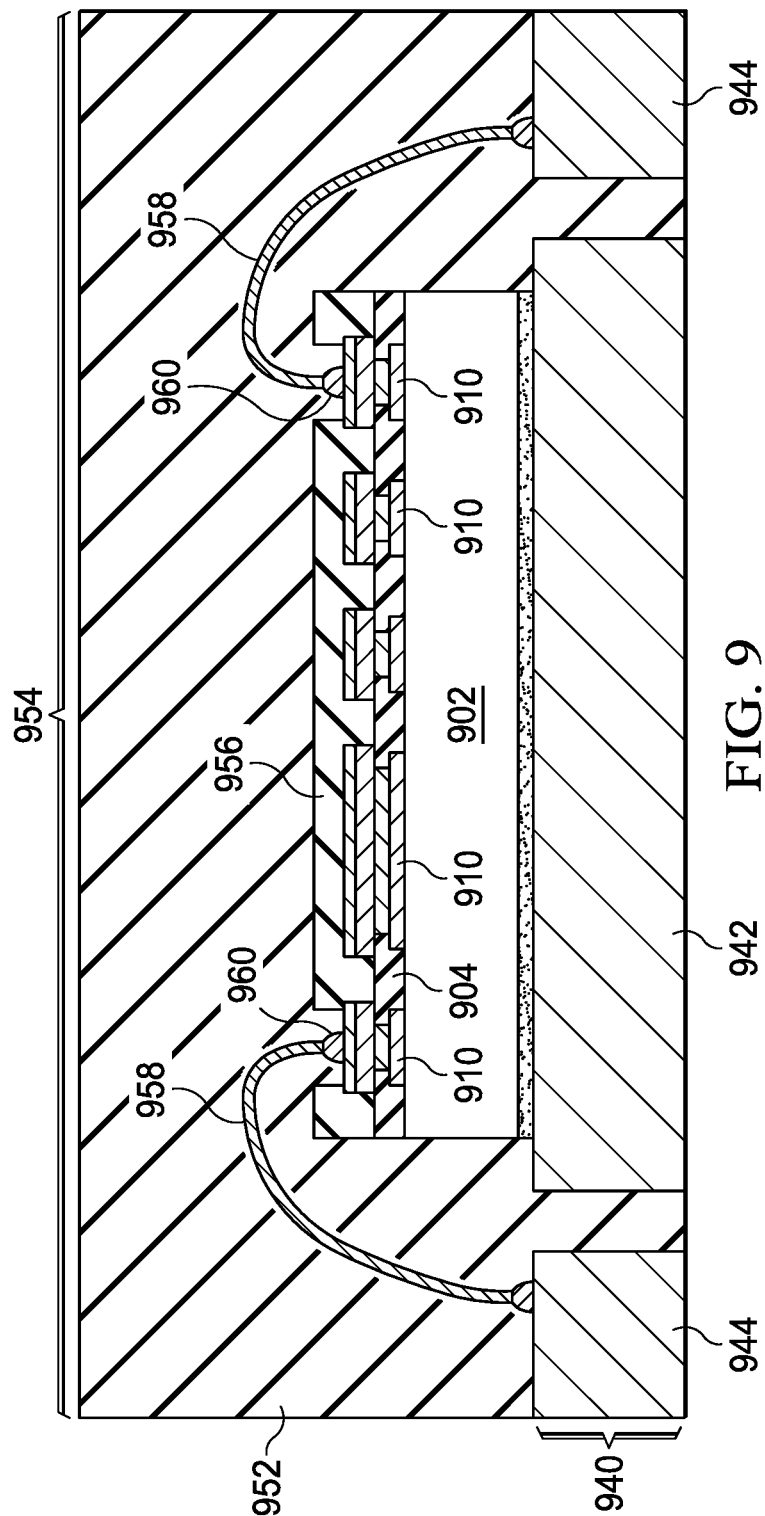
FIG. 9 is a cross sectional view of a packaged semiconductor device.

FIG. 9 is a cross sectional view of an example packaged semiconductor device 954 that can be formed by the process steps of FIG. 8 as described above. In FIG. 9 a wire bonded semiconductor die 902 is shown packaged in a quad flat no-leads (QFN) package. Semiconductor die 902 is mounted on a die mount area 942 of a lead frame or other substrate 940. Leads 944 of substrate 940 are coupled to the bond pads 960 on the semiconductor die 902 by bond wires 958. A protective overcoat layer 956 covers the conductors 910 on the active device side of the semiconductor die on substrate 902, and openings in the protective overcoat layer 956 expose the bond pads 960 for bonding. A dielectric layer 904 is shown on the active surface of semiconductor substrate 902, in a practical example layer 904 may have several layers and conductors 910 may also have several layers that are electrically insulated from one another by additional dielectric layers such as 904, and with vias extending between the conductor layers and extending through the dielectric layers that provide electrical connections between the conductor layers. Mold compound 952 covers the semiconductor die 902, the bond wires 958, and portions of substrate 940, while portions of leads 944 are left uncovered with mold compound. The uncovered portions of leads 944 enable electrical connection to the packaged semiconductor device 954.

Figure 10:
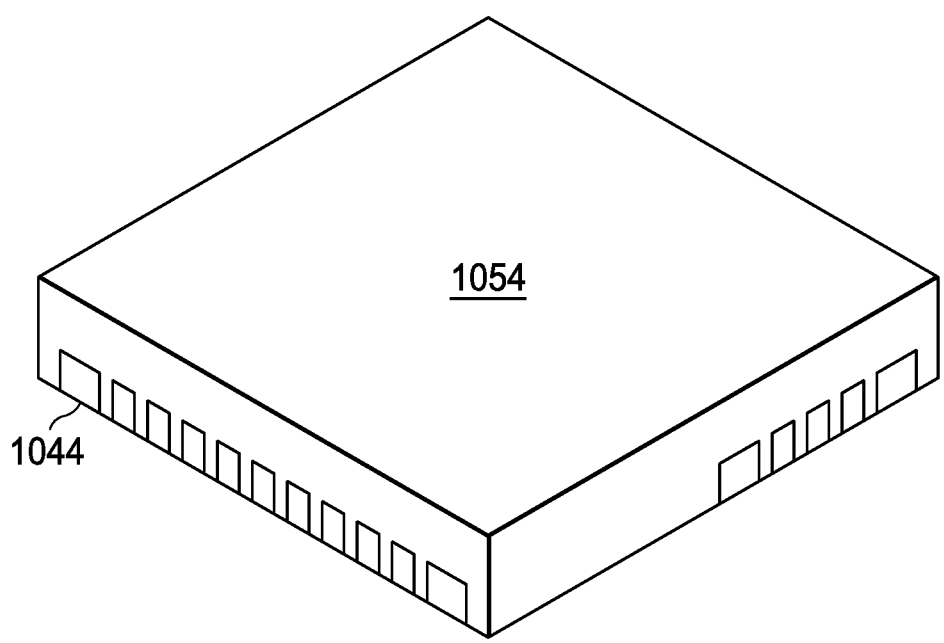
FIG. 10 is a projection view of a packaged semiconductor device.

FIG. 10 is a projection view of a quad flat no leads (QFN) packaged semiconductor device 1054 that similar to the packaged semiconductor device 954 in FIG. 9. In FIG. 10, the packaged semiconductor device is formed by the mold compound with portions of leads 1044 exposed from the mold compound to form electrical terminals for the packaged semiconductor device 1054. Other packages can be used with the arrangements including ball grid array (BGA) packages, small outline packages with leads or small outline no lead (SON) packages, and other leaded and no lead semiconductor packages can be used with the arrangements.

Modifications and variations are contemplated and can be made in the described arrangements, and other alternative arrangements are possible that are within the scope of the claims.

What is claimed is:

1. A method for making a semiconductor device, comprising:
    forming stress induced dislocations in scribe lanes between semiconductor dies on a semiconductor wafer;
    mounting a first side of the semiconductor wafer on a first side of a first dicing tape having an adhesive, forming a wafer dicing assembly;
    attaching a first side of a second dicing tape that has an adhesive to a second side of the semiconductor wafer and to the first side of the first dicing tape in portions of the first dicing tape spaced from the semiconductor wafer;
    separating the semiconductor dies one from another by simultaneously stretching the first dicing tape and stretching the second dicing tape to open gaps in the scribe lanes by extending the stress induced dislocations formed in the semiconductor wafer in the scribe lanes;
    removing the second dicing tape from the semiconductor dies which are now singulated dies spaced from one another;
    removing the singulated semiconductor dies from the first dicing tape;
    positioning singulated semiconductor dies on die mount portions of a substrate in a substrate strip;
    coupling leads of the substrate to bond pads on the semiconductor dies;
    covering the semiconductor dies and at least a portion of the leads in mold compound;
    cutting the substrate strip and the mold compound along saw streets to separate the semiconductor dies covered in mold compound and mounted to the substrate, forming separate packaged semiconductor devices each including a semiconductor die.

2. The method of claim 1, wherein the packaged semiconductor device forms a quad flat no lead (QFN) packaged device.

3. The method of claim 1, wherein the packaged semiconductor device forms a small outline no lead (SON) package.

4. The method of claim 1, wherein the first dicing tape and the second dicing tape are the same type of dicing tape.

5. The method of claim 1, wherein the first dicing tape is a different type than the second dicing tape.

6. The method of claim 1, wherein the adhesive on the first side of the second dicing tape is light sensitive and further comprising exposing the adhesive of the second tape to light prior to removing the second tape.

7. The method of claim 6, wherein the light is ultraviolet (UV) light.

8. The method of claim 1 wherein prior to applying the first dicing tape, the semiconductor wafer is placed into a laser dicing tool, and laser dicing is performed to form the stress induced dislocations in the semiconductor wafer in the scribe lanes.

9. The method of claim 1 wherein prior to attaching the second dicing tape, the wafer dicing assembly is placed into a wafer sawing tool and the wafer sawing tool cuts through a portion of the semiconductor wafer along scribe lanes, forming the stress induced dislocations in the semiconductor wafer.

10. The method of claim 9, wherein the portion is at least half a thickness of the semiconductor wafer.

11. A method of making a semiconductor device, comprising:
    mounting a device side of a semiconductor wafer on a first side of a backgrinding tape;
    loading the backgrinding tape and semiconductor wafer into a dicing tool;
    forming stress induced dislocations along scribe lanes between semiconductor dies on the semiconductor wafer using a laser in the dicing tool;
    attaching an adhesive on a first side of a first dicing tape to a first side of a dicing ring;
    mounting a first side of the semiconductor wafer on the first side of the first dicing tape, forming a wafer dicing assembly;
    removing the backgrinding tape from the semiconductor wafer;
    attaching a first side of a second dicing tape that has an adhesive to a second side of the semiconductor wafer opposite the first side, the second dicing tape adhering to portions of the first dicing tape that are spaced from the semiconductor wafer;
    adhering the second dicing tape to a second side of the dicing ring, forming a dual taped wafer dicing assembly;
    loading the dual taped wafer dicing assembly into a die singulation tool with a dicing tape stretching table;

separating the semiconductor dies by stretching the first dicing tape and stretching the second dicing tape with the dicing tape stretching table;

removing the second dicing tape from the semiconductor dies; and removing the semiconductor dies from the first dicing tape.

12. The method of claim 11, wherein the first dicing tape and the second dicing tape are a same type of dicing tape.

13. The method of claim 11, wherein the first dicing tape is different than the second dicing tape.

14. The method of claim 11, wherein the adhesive on the second dicing tape is light sensitive and further comprising exposing the second adhesive to light prior to removing the second dicing tape.

15. The method of claim 14, wherein the light is ultraviolet (UV) light.

16. The method of claim 11, wherein the semiconductor dies are square and have a dimension of less than 1 mm per side.

17. The method of claim 11, wherein the semiconductor wafer has a top metal layer that is greater than 2 µms thick.

18. The method of claim 11, wherein the semiconductor wafer has a passivation coating greater than 7 µms thick.

19. A method for making a semiconductor device, comprising:

adhering a first side of a first dicing tape that has an adhesive to a first side of a dicing ring;

mounting a first side of a semiconductor wafer on the first side of the first dicing tape, the semiconductor wafer having semiconductor dies spaced by scribe lanes between the semiconductor dies;

partially cutting through the semiconductor wafer along scribe lanes;

adhering a first side of a second dicing tape with a light sensitive adhesive to a second side of the semiconductor wafer and to portions of the first dicing tape spaced from the semiconductor wafer;

adhering the first side of the second dicing tape to a second side of the dicing ring, forming a dual taped wafer dicing assembly;

loading the dual taped wafer dicing assembly into a dicing tool with a dicing tape stretching table;

separating the semiconductor dies from the wafer and from one another by stretching the first dicing tape and stretching the second dicing tape with the dicing tape stretching table, expanding the cuts in the semiconductor wafer along the scribe lanes between the semiconductor dies;

exposing the light sensitive adhesive to light;

removing the second dicing tape from the semiconductor dies; and removing the semiconductor dies from the first dicing tape.

20. The method of claim 19, wherein the light is ultraviolet (UV) light.

21. The method of claim 19, and further comprising exposing the first dicing tape to light after the second dicing tape is removed, where the first dicing tape is a light release dicing tape.

22. The method of claim 21, wherein the light is UV light.

23. The method of claim 19, wherein the first side is a device side of the semiconductor wafer.

24. The method of claim 19, wherein the first side is a non-device side of the semiconductor wafer.

25. The method of claim 19, wherein the partially cutting is performed by sawing.

26. The method of claim 19, wherein the partially cutting is performed by laser cutting.

* * * * *